US006307688B1

United States Patent
Merz et al.

(10) Patent No.: US 6,307,688 B1
(45) Date of Patent: Oct. 23, 2001

(54) OPTICAL SYSTEM, IN PARTICULAR PROJECTION-ILLUMINATION UNIT USED IN MICROLITHOGRAPHY

(75) Inventors: Erich Merz, Essingen; Jochen Becker, Oberkochen, both of (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/444,815

(22) Filed: Nov. 22, 1999

(30) Foreign Application Priority Data

Dec. 23, 1998 (DE) .............................................. 198 59 634

(51) Int. Cl.[7] .................................................... G02B 7/02
(52) U.S. Cl. .............................................................. 359/819
(58) Field of Search .................................. 359/819, 811, 359/817, 818, 697

(56) References Cited

U.S. PATENT DOCUMENTS

| | | | | |
|---|---|---|---|---|
| 3,957,359 | * | 5/1976 | Meginnis | 350/319 |
| 4,017,878 | | 4/1977 | Hagiwara | 396/530 |
| 4,161,120 | | 7/1979 | Cloarec | 73/494 |
| 5,249,082 | * | 9/1993 | Newman | 359/813 |
| 5,521,764 | * | 5/1996 | Balogh et al. | 359/824 |
| 5,774,274 | * | 6/1998 | Schachar | 359/666 |
| 5,966,248 | * | 10/1999 | Kurokawa | 359/697 |

FOREIGN PATENT DOCUMENTS

| 0 660 169 A1 | 12/1994 | (EP) . |
| 0 678 768 A2 | 4/1995 | (EP) . |

OTHER PUBLICATIONS

Opto–mechanical systems design/Paul R. Yoder, Jr., 2nd Edition, rev. and expanded, vol. 35, 1992.

* cited by examiner

*Primary Examiner*—Georgia Epps
*Assistant Examiner*—Gary O'Neill
(74) *Attorney, Agent, or Firm*—Welsh & Katz, Ltd.

(57) ABSTRACT

An optical system, in particular for projection-illumination units used in microlithography, in particular with a slot-shaped field of view or non-rotationally symmetrical illumination, has an optical element 1, in particular a lens or a mirror, which is arranged in a mount 7 or an inner ring 2, and actuators 8a, 8b and 9a, 9b. A plurality of actuators 8a, 8b and 9a, 9b act on the deformable inner ring 2 via a radial force-displacement transmission 12, 13 in order to generate tensile and/or compressive forces.

9 Claims, 2 Drawing Sheets

Figure 1:
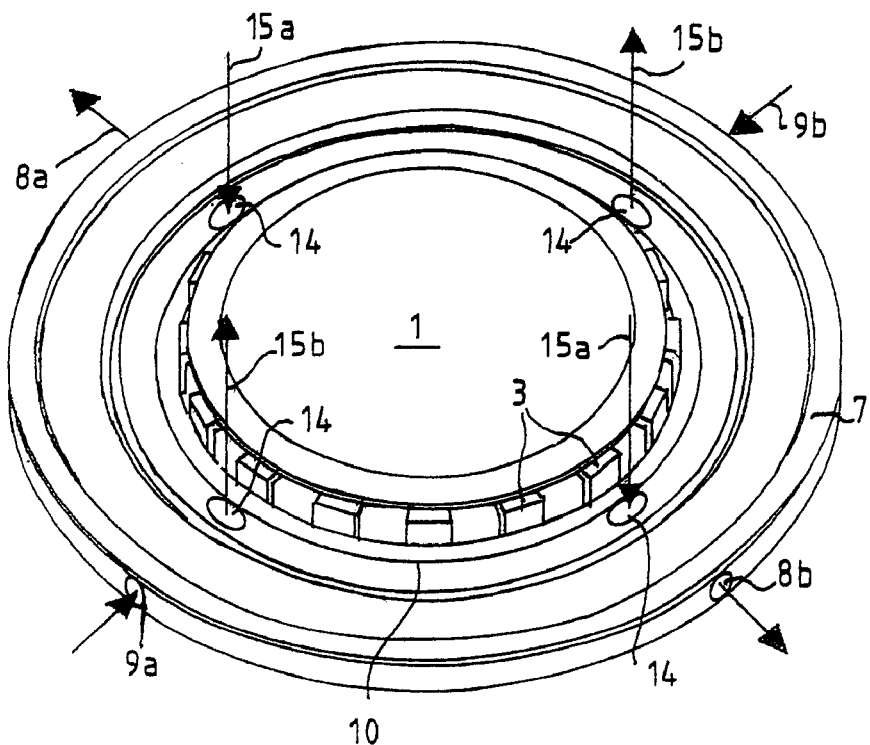

OPTICAL SYSTEM, IN PARTICULAR PROJECTION-ILLUMINATION UNIT USED IN MICROLITHOGRAPHY

BACKGROUND OF THE INVENTION

The invention relates to an optical system, in particular a projection-illumination unit used in microlithography, of the type defined in more detail in the preamble of claim 1.

EP 0 678 768 A2 has described an optical system of the type described in the introduction, in which stepping and scanning processes are employed and only a narrow, slot-like strip is transmitted from a mask to a waver. To illuminate the entire field, a reticle and the waver are displaced laterally (scanning).

However, a drawback of the optical system according to this prior art is that the slot geometry results in a rotationally asymmetric illumination replication especially on lenses which are close to the waver. This means that the temperature distribution which results from the inevitable heating of the lens is likewise rotationally asymmetrical on the lens, and therefore, owing to the linear correlation between refractive index and temperature and owing to thermal expansion, image errors, such as for example astigmatism, arise on the optical axis.

A further problem with an optical system of this nature is the so-called compaction effect, i.e. aging caused by the irradiation, and this effect likewise leads to image errors.

In EP 0 678 768 A2, it is proposed to use a lens as a "final control element", in order to correct the image error which is produced by uneven heating of the lens. For this purpose, forces which act in the radial direction are allowed to act on the lens. However, a drawback of this solution is that only compressive forces are generated, resulting in an asymmetric change in thickness.

EP 0 660 169 A1 has described a projection-illumination unit which is used in microlithography and in which objectives are provided with correction elements. These include a pair of lenses which can be rotated about the optical axis. In this case, the refractive power from the shape of the lens is altered by superimposing a cylindrical meniscus shape on a spherical lens.

SUMMARY OF THE INVENTION

The present invention is based on the object of providing an optical system of the type mentioned at the outset in which image errors, such as those which are formed, for example, by uneven temperature distribution and/or the compaction effect, can be corrected or at least significantly reduced by means of controlled astigmatism.

According to the invention, this object is achieved by means of the features listed in the defining part of claim 1.

In contrast to the prior art, not only compressive forces, which result only in an asymmetric change in thickness, are produced, but also, by means of controlled tensile and/or compressive forces, the optical element, e.g. a lens, is deformed, this deformation being selected in such a way that image errors which arise can be compensated to a very substantial extent.

In one configuration according to the invention, it is possible, for the force-displacement transmission, to provide a lever transmission with a lever, at least one actuator acting on one end of the lever and the lever, at another end which is directed toward the inner ring, acting on the inner ring, in such a manner that a force which is parallel to the optical axis is generated on the inner ring.

By suitably arranging or distributing the tensile and compressive forces, which are accordingly distributed over the circumference, it is possible to produce, for example, a dual ripple for the inner ring which supports the lens, and therefore also for the lens. This is the case in particular if the tensile and compressive forces are in each case 180° opposite one another, with tensile and compressive forces in each case alternating at 90° intervals and the inner ring being fixedly connected to the mount by means of connections which are in each case located between these forces.

The astigmatism which is produced in this way makes it possible to substantially compensate for image errors. In practice, the optical element, such as for example a lens, assumes a saddle-like form with the deformation produced in this way.

If necessary, it is also possible to provide "overcompensation", in order in this way to correct additional compensation for production defects or image errors from other optical elements in the system. In this way, it is possible, overall, to provide compensation for an entire objective or an illumination unit using simple means.

Various energy generators for generating the tensile and compressive forces are possible; generally, in order to increase the accuracy or to provide an appropriate precision adjustment, a lever transmission will be employed. As simple tensile and compressive force generators, it is possible to use actuators in the form of piezo-units or of hydraulic units or, advantageously, mechanical tensile and compressive units which can be arranged in the mount in a simple structure. This measure allows the mount at the same time to be used to seal the hydraulics or to accommodate the tensile and compressive units.

CONCISE DESCRIPTION OF THE DRAWINGS

Figure 2:
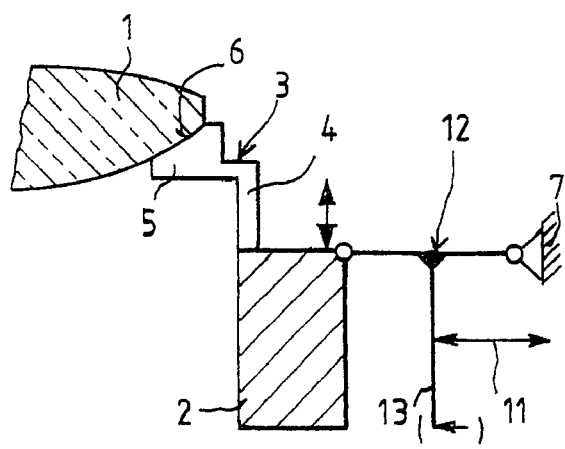
Figure 3:
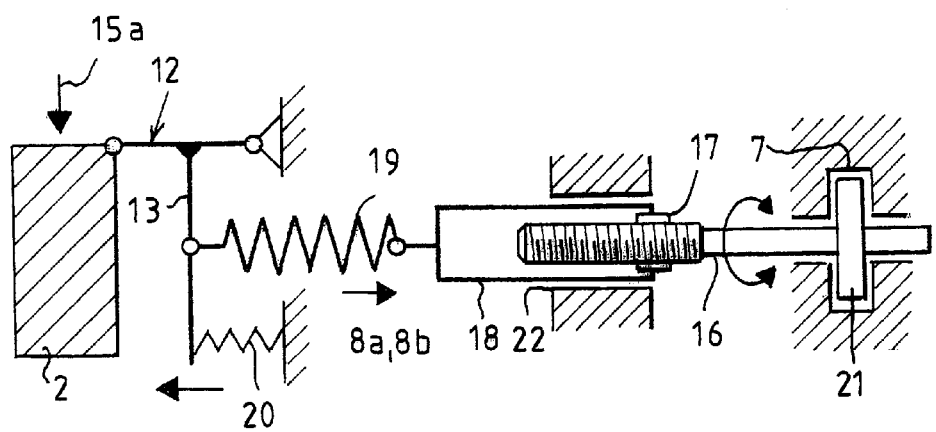
Figure 4:
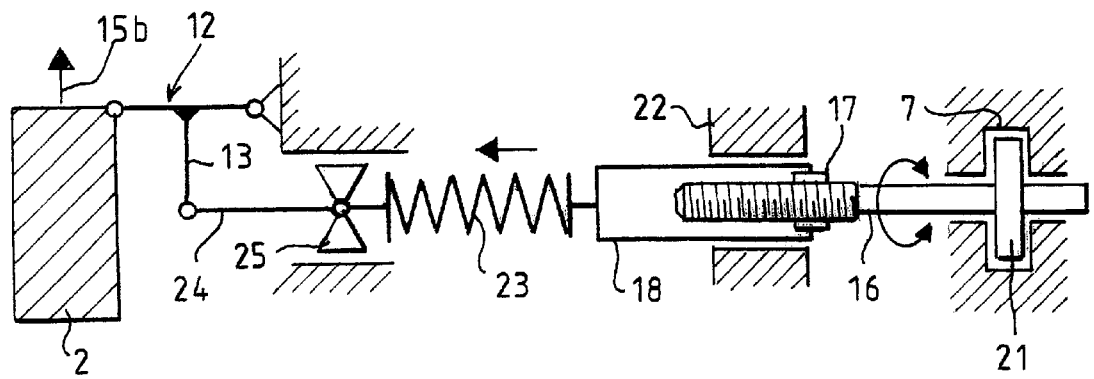

Advantageous refinements and configurations will emerge from the remaining subclaims and from the exemplary embodiment which is described in principle below with reference to the drawing, in which:

FIG. 1 shows a perspective illustration of an optical system with an inner ring which is connected to a mount, FIG. 2 shows an illustration of the functional principle for the generation of tensile and compressive forces on the deformable inner ring on which the optical element is mounted, FIG. 3 shows a diagrammatic illustration of a mechanical tensile unit for generating a tensile force, and FIG. 4 shows a diagrammatic illustration of a mechanical compressive unit for generating a compressive force.

DETAILED DESCRIPTION OF THE INVENTION

Since a projection-illumination unit is generally known in the field of microlithography, the following text only describes an optical element 1 which is fitted in a unit of this nature and which, for this purpose, is mounted in or on an inner ring 2 which is connected to a mount 7.

The optical element, e.g. a lens 1 (only partially shown in FIG. 2, but illustrated in full in FIG. 1) is mounted on a multiplicity of bearing feet 3 which are of angular design and are distributed uniformly over the circumference of an inner ring 2. Those parts 4 of the bearing feet 3 which are in each case connected to the inner ring 2 lie parallel to the optical axis. Inwardly directed intermediate parts 5 of the bearing feet 3, which have bearing surfaces 6 for the lens 1, run at right angles to the optical axis. This design of the bearing feet 3 on the one hand provides an accurate mounting and, on the other hand, also provides elasticity in order for deformations to be introduced onto the lens 1 as optical element.

In a mount 7 which surrounds the inner ring 2, there are two actuators which are 180° opposite one another and are in the form of tensile units 8a and 8b which generate tensile forces acting in the radial direction, i.e. perpendicular to the optical axis. Two further compressive units 9a, 9b, which generate compressive forces, likewise in the radial direction, are also positioned 180° opposite one another, and offset through 90° with respect to the tensile units. The tensile and compressive units are only diagrammatically indicated in FIG. 1 and are described with regard to their broad functional principle in FIG. 3 and 4 below.

A connection 10, by means of which the inner ring 2 is fixedly connected to the mount 7, is located centrally between in each case two tensile and compressive units which are offset by 90° with respect to one another, i.e. this connection is in each case at 45° between said units. The connection may be of any desired form. In FIG. 1, these connections are likewise only diagrammatically depicted, and only three of the four connections 10 are visible, owing to the perspective illustration.

The radial tensile/compressive forces applied by the tensile and compressive units 8a, 8b and 9a, 9b, corresponding to arrow direction 11 in FIG. 2, are converted in the following way into forces which act parallel to the Z-axis and product astigmatism.

As can be seen from FIG. 2, for this purpose a lever transmission with elbow levers 12 is provided, said levers being located between the inner ring 2 and the mount 7. The elbow levers 12 are each T-shaped in cross section, with the crossbar of the T extending at right angles to the optical axis. At one end of the lever or of the crossbar of the T, the elbow lever 12 is connected in a resilient or articulated manner to the mount 7, and at the other end, facing toward the inner ring 2, is connected to the inner ring 2 in a corresponding articulated manner. Between the two ends of the crossbar of the T, there is a lever arm 13 which extends perpendicular to said crossbar and parallel to the Z-axis and on which the tensile and compressive forces 11 from the tensile and compressive units 8a, 8b and 9a, 9b act.

In accordance with the number and arrangement of the tensile and compressive units 8a, 8b and 9a, 9b, four elbow levers 12 are provided, distributed at intervals of 90° over the circumference. This means that, together with the four connections 10, the inner ring 2 is elastically connected to the mount 7 via a total of eight connection points. Pockets 14 between the inner ring 2 and the mount 7 can be seen in FIG. 1, in which pockets the elbow levers 12 are fitted.

Depending on the arrow direction 11 in which the force acts, in the exemplary embodiment forces which are alternately directed downward or upward over the circumference are produced on the inner ring 2, in accordance with the arrows 15a (directed downward) and 15b (directed upward) which are illustrated in FIG. 1.

In principle, it is also possible to generate astigmatism by means only of tensile or compressive forces, i.e. only upwardly or downwardly directed forces, but the selected design in alternating form, due to the fixed connection 10 located between each of these points of action for the forces, results in a dual ripple or saddle shape in the lens 1, with the advantage that there is then no displacement of the lens 1 in the Z-direction.

The tensile and compressive forces illustrated in FIGS. 3 and 4 at the same time also produce a transmission in such a manner that a large displacement is converted into a sensitive adjustment of the lens 1. Transmission ratios can be varied easily, in part by selecting the lever lengths.

The tensile and compressive units 8a, 8b and 9a, 9b which are illustrated in FIGS. 3 and 4, FIG. 3 showing a tensile unit and FIG. 4 showing a compressive unit, have a spindle drive 16 which is held in the mount 7. The spindle nut 17 of the spindle drive 16 is connected to a guide sleeve 18 which is likewise held in the mount 7. One end of a tension spring 19 is connected to the guide sleeve 18, while its other end acts on the lever arm 13 of the elbow lever 12. To produce downwardly directed forces 15a on the lens 1, the spindle drive 16 is rotated in such a manner that a translational movement in the direction of arrow 8a, 8b is produced via the spindle nut 17 and therefore also for the guide sleeve 18. If a suitably "soft" tension spring 19 is used, it is possible, by converting a large movement, i.e. with a plurality of spindle rotations, into a small movement, resulting in a slight or sensitive adjustment force in the direction of arrow 15a.

If necessary, a prestressing spring 20 may also be provided in order to balance the tension spring 19. The way in which the spindle drive 16 is secured in the mount 7 is illustrated diagrammatically by means of a wheel 21 and sliding bearings 22 for the guide sleeve 18.

The compressive unit illustrated in FIG. 4 is of fundamentally similar structure and also contains the same components. In this case, however, a compression spring 23 is provided instead of a tension spring 19, which compression spring, when the spindle drive 16 is rotated, resulting in a translational movement of the spindle nut 17 with the guide sleeve 18, generates a movement in the direction of arrow 9a, 9b. An upwardly directed force 15b acting on the lens 1 is the result, via the lever arm 13 of the elbow lever 12 on which a pressure rod 24, which is connected to the compression spring 23, acts. In addition to the mounting shown in FIG. 3, the compression spring 23 and the pressure rod 24 require the provision of additional mounting or guidance 25 on the pressure rod 24.

Naturally, hydraulic units may also be used instead of the mechanical tensile and compressive units which have been described in principle in FIGS. 3 and 4 in order to generate the forces 15a and 15b. A piezo-drive is also conceivable.

What is claimed is:

1. An optical system, in particular a projection-illumination unit used in microlithography, in particular with a slot-shaped filed of view or non-rotationally symmetrical illumination, which has an optical element, in particular a lens or a mirror, which is arranged in a mount or an inner ring, and actuators which act on the optical element and/or the inner ring, wherein a plurality of actuators act on the deformable inner ring via a radial force-displacement transmission to generate a force parallel to the optical axis on the inner ring.

2. The optical system as claimed in claim 1, wherein a lever transmission with a lever is provided for the force-displacement transmission, at least one actuator acting on one end of the lever and the lever, at another end which is directed toward the inner ring, acting on the inner ring.

3. The optical system as claimed in claim 1, wherein tensile or compressive forces which are in each case 180° opposite one another act on levers, tensile and compressive forces in each case alternating at 90° intervals, and the inner ring being fixedly connected to the mount by means of connections which are in each case located between these forces.

4. The optical system as claimed in claim 2, wherein the levers are designed as elbow levers which are arranged at intervals of 90° between the inner ring and the mount, the elbow levers, on their outer circumference, being resiliently connected to the mount and, on their inner circumference, acting, in an articulated manner, on the inner ring, and the actuators each acting on a lever arm, which runs parallel to the optical axis, of the elbow levers.

5. The optical system as claimed in claim 1, wherein angled bearing feet are distributed over the circumference of the inner ring, those parts of the feet which are connected to the inner ring being oriented parallel to the optical axis, and intermediate parts which run inward at right angles to this axis having bearing surfaces for the optical element.

6. The optical system as claimed in claim 1, wherein the actuators are designed as mechanical tension and compression units.

7. The optical system as claimed in claim 6, wherein the tension and compression units are provided with a spindle drive, it being possible to exert a tensile and compressive force, via the spindle nut, on a spring device which acts on the associated lever.

8. The optical system as claimed in claim 7, wherein the spring device is used to convert a large adjustment displacement into a fine adjustment on the lever.

9. The optical system as claimed in claim 8, characterized in that the tension and compression units are arranged in holes in the mount.

* * * * *

UNITED STATES PATENT AND TRADEMARK OFFICE
CERTIFICATE OF CORRECTION

PATENT NO. : 6,307,688 B1
DATED : October 23, 2001
INVENTOR(S) : Merz et al.

It is certified that error appears in the above-identified patent and that said Letters Patent is hereby corrected as shown below:

Column 4,
Line 46, instead of "filed" insert -- field --.

Signed and Sealed this

Twenty-third Day of July, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,307,688 B1
DATED : October 23, 2001
INVENTOR(S) : Erich Merz and Jochen Becker It is certified that error appears in the above-identified patent and that said Letters Patent is hereby corrected as shown below:

Title page,
Item [54], Title, delete "PROJECTION-ILLUMINATION" and replace with
-- PROJECTION-EXPOSURE --.
Item [57], ABSTRACT, delete "projection-illumination" and replace with
- projection-exposure --.

Column 1,
Lines 7 and 36, delete "illumination" and replace with -- exposure --.

Column 2,
Lines 21 and 54, delete "illumination" and replace with -- exposure --.

Column 4,
Line 45, delete "illumination" and replace with -- exposure --.

Signed and Sealed this

Third Day of May, 2005

JON W. DUDAS
*Director of the United States Patent and Trademark Office*